United States Patent
Sheng et al.

(10) Patent No.: US 6,309,944 B1
(45) Date of Patent: Oct. 30, 2001

(54) OVERLAY MATCHING METHOD WHICH ELIMINATES ALIGNMENT INDUCED ERRORS AND OPTIMIZES LENS MATCHING

(75) Inventors: Han-Ming Sheng, Shin-Chu; Cheng-Chen Kuo, Kaohsiung; Chu-Wen Huang, Chung-Li; Kuo-Hung Chao, Chai-yei County, all of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/578,413

(22) Filed: May 26, 2000

(51) Int. Cl.⁷ .......................... H01L 21/76; H01L 21/66; H01L 21/302; H01L 23/29
(52) U.S. Cl. .......................... 438/401; 438/18; 438/725; 257/797
(58) Field of Search .................................. 438/401, 725, 438/18; 257/797; 430/22, 312

(56) References Cited

U.S. PATENT DOCUMENTS

| | | | |
|---|---|---|---|
| 5,252,414 | 10/1993 | Yamashita et al. | 430/22 |
| 5,510,892 * | 4/1996 | Mizutani et al. | 356/139.1 |
| 5,668,042 * | 9/1997 | Bae | 438/18 |
| 5,733,711 * | 3/1998 | Juengling | 430/312 |
| 5,776,645 | 7/1998 | Barr et al. | 430/22 |
| 5,783,342 | 7/1998 | Yamashita et al. | 430/30 |
| 5,877,861 | 3/1999 | Ausschnitt et al. | 356/401 |
| 5,989,762 | 11/1999 | Takaoka | 430/30 |
| 6,042,975 * | 3/2000 | Burm et al. | 430/22 |

FOREIGN PATENT DOCUMENTS

0098984-A1 * 1/1984 (EP) .
404101412-A * 4/1992 (JP) .......................... 21/27

* cited by examiner

Primary Examiner—Trung Dang
Assistant Examiner—Brook Kebede
(74) Attorney, Agent, or Firm—George O. Saile; Stephen B. Ackerman

(57) ABSTRACT

A new method is provided to align overlying layers for wafer stepper tools that are use for the manufacturing of semiconductor devices. A reference stepper and a reference mask are used, the mask contains a pattern of reference alignment marks that are created using this mask in a reference first surface on a substrate. A matching stepper that must be calibrated against the reference stepper is then used to create, using the reference mask, alignment marks in a second surface on a substrate. The alignment error between the reference alignment marks and the alignment marks that have been created in the second surface are measured and used as input to software modeling programs that provide numerical data indicating the corrections that must be applied to the matching stepper in order to adjust the alignment of the matching stepper to the alignment of the reference stepper.

3 Claims, 2 Drawing Sheets

FIG. 1 - Prior Art

OVERLAY MATCHING METHOD WHICH ELIMINATES ALIGNMENT INDUCED ERRORS AND OPTIMIZES LENS MATCHING

BACKGROUND OF THE INVENTION (1) Field of the Invention

The invention relates to the fabrication of integrated circuit devices, and more particularly, to a method to improve overlay alignment accuracy for wafer stepper tools.

(2) Description of the Prior Art

During the manufacturing of semiconductor devices, many of the processing steps that are applied have as objective to create individual device features in addition to creating device interconnect patterns. For each of these steps, specific geometries are created in layers of materials that are used to form the semiconductor device, a most common method that is applied for the creation of these various geometries uses methods of photolithography whereby a mask contains patterns that are to be created. Since many of the layers that are created as part of a semiconductor device interact and are mutually dependent, it is of key importance that the successively overlying layers are within strict limits of alignment so that the relative positioning of each overlying layer is precisely controlled and adjusted with respect to one or more underlying layers that have previously been exposed. For the purpose of alignment of successive and overlying patterns, a number of different methods are typically used, these methods are mostly dependent on alignment markers that have been provided for this purpose in the surface of the substrate that is used to create the semiconductor device.

Alignment errors can occur in a number of manners. For instance, and hereby referring to a lower field and an upper field whereby the lower field is the field to which the upper field must be aligned, the upper field may be rotated with respect to the lower field, the upper field may be shifted in a X-direction or a Y-direction or in both X and Y directions with respect to the lower field, the upper field may be divided into a multiplicity of fields (a field grid) whereby a subset of this multiplicity of fields is either magnified or reduced in size relative to the lower field or individual sections of the upper field are shifted in unequal amounts with respect to the lower field, the individual sections of an upper field may be skewed or rotated around an axis with respect to the lower field, the individual sections of the upper field (the field grid) may have shifted in an outward direction either uniformly or non-uniformly with respect to the lower field, and the like.

In order to control and evaluate alignment accuracy, the typical parameter that is used for this purpose is to measure the intra-field error that is incurred when exposing two overlying fields. This method makes use of sets of (square or rectangular shaped) alignment marks whereby one set of alignment marks is centered within the geometric boundaries of a second set of alignment marks. These alignment marks can be provided to individual fields within the field grid (thereby surrounding each field on all sides) or these alignment marks can be omitted between adjacent fields of a field grid. The number and placement of the alignment marks is open to interpretation and specific design requirements, key to this method however is that the individual alignment marks for the upper field fit within and are surrounded by the individual alignment marks of the lower field. It is from this easy to realize that a measurement can readily be made that measures the distance between the sides of the two sets of alignment marks, a measurement that is directly indicative of the accuracy of alignment between the two layers. A measurement of equal value of the distance between the sides of the upper level and the lower level alignment marks in both the X and the Y direction along all four sides of the alignment marks indicates that the two sets of alignment marks are in perfect alignment and, with that, the exposure for the upper level is in alignment with the exposure for the lower level. Where these measurements differ in value, elementary observations and deductions will lead to conclusions of the extent and the direction of misalignment that occurs between the upper and the lower level. This measured misalignment can directly be converted into a readjustment of the stepper tool to the point where the misalignment is eliminated and again the upper and the lower level are in perfect alignment. This method of evaluating alignment between two overlying layers leads not only to measuring misalignment between an upper and a lower layer in the X and Y direction but further serves to identify any problems of rotation of the upper layer with respect to the lower layer. It must be realized that the alignment marks are not limited to relatively small sections on the surface of the substrate so that any error of alignment will be highlighted and is therefore readily identifiable due to the extended distance between the various alignment marks.

The conventional method of measuring and correcting alignment errors requires the steps of measuring the overlays of the alignment marks as previously indicated, calculating the required adjustments based on the relative field size of the lower and the upper field, updating or interfacing with (if required) an existing data base to further influence future alignment procedures and finally affecting the correction in alignment, if any.

Various field sizes of the field grid can have an effect on the process of mark alignment. Overlying fields are not necessarily of uniform size or of uniform ratio between upper and lower field size. Furthermore, fields of one level may overlay a field of the next level causing further confusion as to how exactly to coordinate the corrections, if any, between the various overlying fields. It must thereby be understood that errors may occur not only between overlying levels (the level-to-level error) but also between fields within one level (within-level between-fields). In making multiple exposures it may therefore be required to correct alignment problems between overlying levels and between fields within a given level. This latter problem may be aggravated for levels that contain fields that differ considerably in size from the size of the fields that are contained in the preceding level. Multiple, smaller size fields in an overlying layer are in this respect particularly prone to cause problems. For all measurements and corrections that are applied in order to gain acceptable inter-level alignment, there is a tolerance of misalignment whereby the alignment is considered acceptable if the alignment between layers falls within the tolerance for the step of alignment measurement. It is clear that this may still lead to considerable misalignment between levels of patterns that are separated by a large number of interposed levels. This can occur in the case where for example all or a large number of tolerances are skewed in the same direction thereby accumulating a build up of a misalignment error between widely separated levels that belong to one construction this is unacceptable.

To further highlight the effect that different field size can have on alignment errors, the example of two tools that have different field and exposure sizes will be highlighted. The first tool has a smaller field size whereby one chip within the surface of the substrate is exposed per field size using one reticle. A second tool has a larger field size whereby four chips on the substrate surface are exposed per field using one reticle. If errors in alignment occur between the one field of the first tool and the four fields of the second tool, the alignment that will be affected between the two tools and based of the measured alignment error may result in alignments for the second tool that cannot compensate as desired for all four fields of the second tool. Not all four fields of the second tool will be correctly adjusted if for instance a rotational error has been measured between the two tools since this rotational error adjustment affects the four fields within the second tool in different amounts of adjustment. Conventional methods address this problem by limiting either the fields that a tool can use or by limiting the number of chips that can be exposed on a particular tool. These limitations ultimately form limitations on production throughput and are therefore to be avoided.

U.S. Pat. No. 5,783,342 (Yamashita et al.) shows a system for measurement of photoresist patterns.

U.S. Pat. No. 5,252,414 (Yamashita et al.) shows a resist evaluation method.

U.S. Pat. No. 5,989,762 (Takaoka) discloses an alignment correcting method for an aligner.

U.S. Pat No. 5,877,861 (Ausschnitt et al.) teaches an overlay control method/system for inter alia, level-to-level control.

U.S. Pat. No. 5,776,645 (Barr et al.) shows a overlay target and methodology.

SUMMARY OF THE INVENTION

A principle objective of the invention is to provide a method of alignment that reduces alignment errors.

Another objective of the invention is to provide a method of alignment that optimizes lens matching for lenses that are used during alignment procedures.

In accordance with the objectives of the invention a new method is provided to align overlying layers for wafer stepper tools that are used for the manufacturing of semiconductor devices. A reference stepper and a reference mask are used, the mask contains a pattern of reference alignment marks that are created using this mask in a reference first surface on a substrate. A matching stepper that must be calibrated against the reference stepper is then used to create, using the reference mask, alignment marks in a second surface on a substrate. The alignment error between the reference alignment marks and the alignment marks that have been created in the second surface are measured and used as input to software modeling programs that provide numerical data indicating the corrections that must be applied to the matching stepper in order to adjust the alignment of the matching stepper to the alignment of the reference stepper.

DESCRIPTION OF THE PREFERRED EMBODIMENTS

Figure 1:
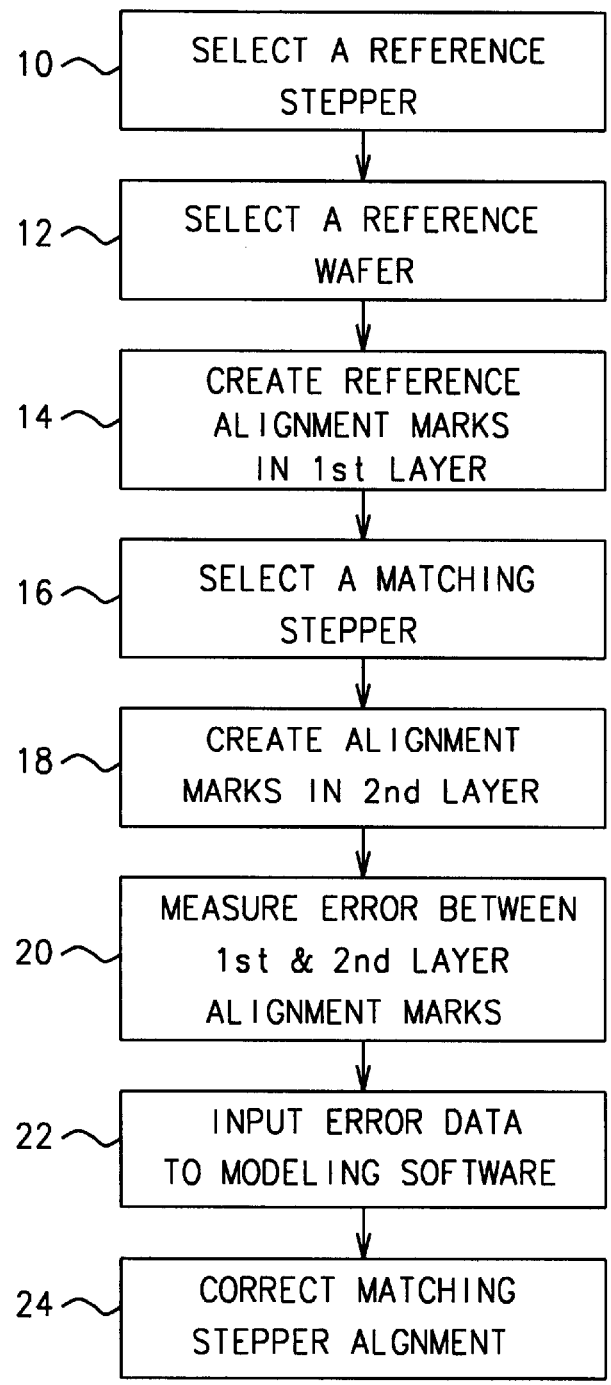
FIG. 1 shows a flowchart of current alignment procedures.

In modern semiconductor manufacturing processes, it is paramount to the competitive viability of a manufacturing process that the process of chip creation is optimized in not only the sense of avoiding the occurrence of chip failures but also in maximizing the chip output that can be produced in a unit of time. It is therefore important that chip exposure is maximized which means that the number of chips that can be created per wafer exposure must be high. This requirement imposes the requirement that the field size is maximized. Due to restraints of stepper capability, field sizes that are used during different levels of chip exposure may vary and, with that, the number of chips that can simultaneously be produced as part of one production cycle. Present day tool capability makes it however not feasible to use field size that is not uniform in a particular manufacturing environment. It is however, as indicated, desirable that a manufacturing process is flexible enough that field size can be non-uniform in order to maximize chip throughput.

The procedures that are presently used to measure stepper alignment are highlighted first. It must in this clearly be remembered that the objective of the procedure is to assure that overlying layers are closely aligned. This can also be stated by saying that an overlying layer (a second layer) must be closely aligned with an underlying layer (a first layer). The following points are in this respect of importance:

1) no errors must be introduced by the lens that is used to observe alignment marks 2) the alignment marks on the first layer serve as points of reference for the alignment of the second layer, these first layer alignment marks must therefore be made using a reference mask that is specially designed for the purpose of creating the first layer reference alignment marks, and 3) a method of providing close alignment between a first and a second layer aligns the second layer while making sure that the auxiliary alignment components, that is the reference alignment marks of the first layer and the lens that is used to observe the alignment marks of the first and the second layer, are constant or that the errors that these components can contribute are accounted for or are eliminated.

Based on the above, a typical alignment procedure is as follows:

1) a reference stepper (holy stepper) is used that is considered and qualified as containing a lens that has been selected for this purpose, based on known lens distortion distribution and lens stacking simulation. Potential errors that can be introduced by the lens (that is used to observe the alignment marks) are therefore known and can be accounted for in subsequent steps of alignment 2) alignment marks are created in a first layer, that is either in the surface of a substrate or in the surface of a first layer that is deposited on the surface of a substrate. The reference (holy) stepper that is indicated under the preceding item is used for the creation of the alignment marks in the first layer, in addition a specially designed reference mask is used for the exposure of the reference alignment marks in the first layer 3) the preceding two steps have created an environment wherein the alignment performance of a matching stepper can be evaluated.

This matching stepper is not the reference stepper but is a stepper that is to be used for regular production runs. The matching stepper is therefore used to expose the alignment marks on the second layer, errors in the alignment of the alignment marks in the second layer are a direct and accurate indication of the alignment errors that the matching stepper has when compared with the reference stepper. The relative positioning between the alignment marks in the first layer and the second layer is measured providing the required data that indicate the corrections that must be applied to the alignment of the matching stepper such that the matching stepper is in exact alignment with the reference stepper. These measurements are used as input data for modeling and simulation software, which evaluates the impact of field size and the like and which provides numerical values of the alignment corrections that must be applied to the matching stepper.

The preceding procedure can be summarized as follows, see FIG. 1:

1) select a reference stepper, FIG. 1, step 10
2) select a reference wafer (FIG. 1, step 12) and create reference alignment marks in a first layer on the surface of this reference wafer (FIG. 1, step 14) by using a special reference mask that is exposed using the reference stepper. This exposure exposes a layer of photoresist that has been deposited to a specified thickness on the surface of the first layer. This layer of photoresist is removed from the surface of the first layer in accordance with the pattern for the alignment marks in the first layer after which the reference alignment marks in the first layer are created
3) identify a matching stepper (FIG. 1, step 16) and create alignment marks in a second layer (FIG. 1, step 18) using the special mask that is used to create the reference alignment marks in a first layer
4) measure relative positioning between first layer and second layer alignment marks (FIG. 1, step 20), which is a direct indication of the alignment differences (or error) between the matching stepper and the reference stepper
5) input the measure alignment differences to modeling and simulation software (FIG. 1, step 22) to calculate the numerical values of the adjustments that must be made to the matching stepper such that the matching stepper is in exact alignment with the reference stepper, and
6) correct the alignment of the matching stepper, (FIG. 1, step 24).

The above procedure uses laser alignment systems (with a wavelength of 632 nm) to determine first and second layer marks positioning while, during the step of exposure for the creation of the reference alignment marks, a layer of photoresist was present over the first or wafer alignment marks. The layer of photoresist is prone to introduce inaccuracies of exposure and measurement due to the light diffusion that is present in the layer of photoresist. The objective of the invention is to remove the layer of photoresist from above the first layer and wafer marks before the procedure is continued for the creation of the first layer alignment marks.

Figure 2:
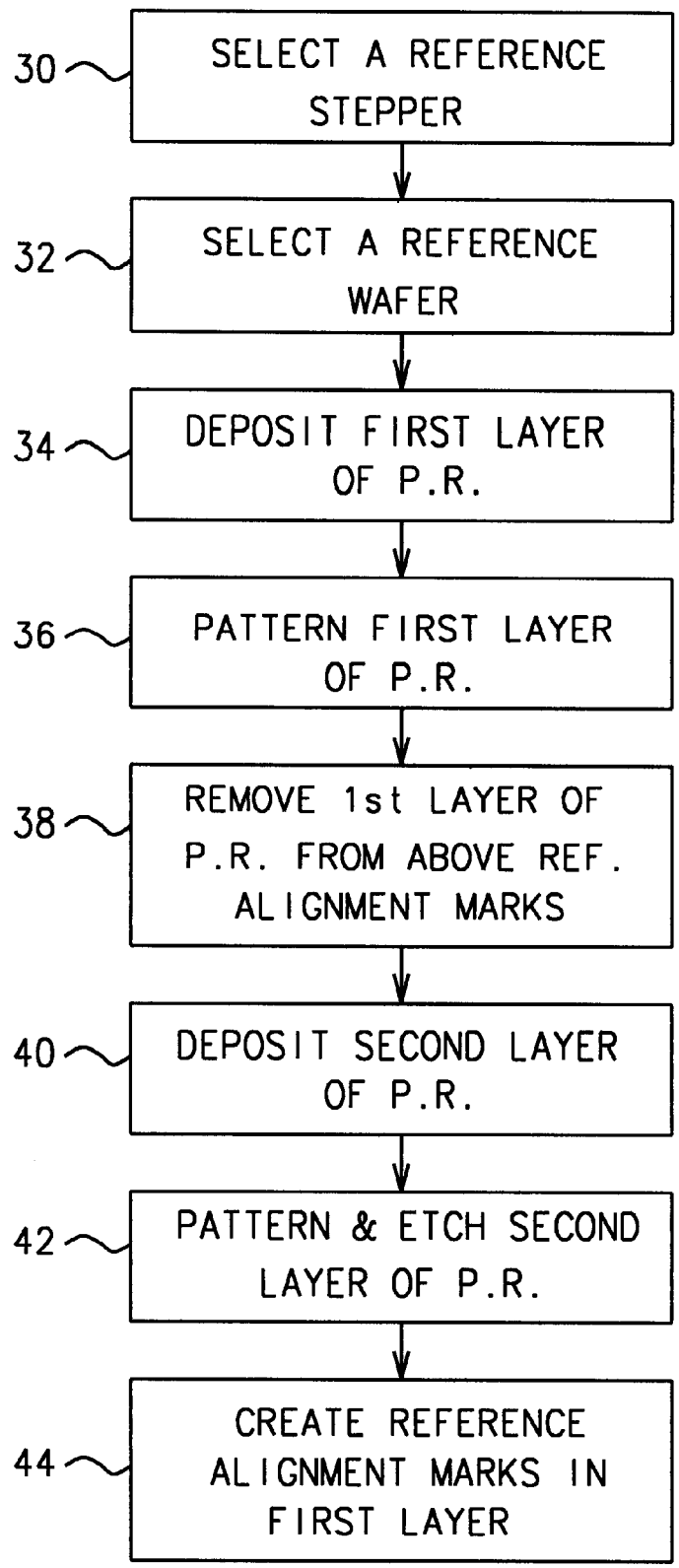
FIG. 2 shows a flow chart of alignment procedures of the invention.

The procedure of the invention is therefore as follows, see FIG. 2:

1) select a reference stepper, (FIG. 2, step 30)
2) select a reference wafer (FIG. 2, step 32) and deposit a first layer of photoresist to a specified thickness on the surface of the reference wafer, (FIG. 2, step 34). This first layer of photoresist is patterned (FIG. 2, step 36) in accordance with the reference pattern for the alignment marks in the first layer and removed from the surface of the first layer in accordance with this reference pattern (FIG. 2, step 38)
3) create the reference alignment marks in the first layer by depositing a second layer of photoresist (FIG. 2, step 40), exposing this second layer of photoresist with the reference mask, developing the second layer of photoresist (FIG. 2, step 42) and etching the reference alignment marks in the first layer (FIG. 2, step 44), and
4) the balance of the procedure is identical to the procedure steps that have been identified above under FIG. 1, steps 16 through 24.

By removing the first layer of photoresist from above the areas where the alignment marks have to be created in the first layer, the second layer of photoresist that is deposited for the creation of the reference alignment marks in the first layer has a profile that follows the profile of the now removed first layer of photoresist which enables more accurate alignment of the stepper tool during the exposure of the second layer of photoresist that is required to created the alignment marks in the first layer. By making this exposure an exposure of higher energy, the exposure for the creation of the reference alignment marks in the first layers can penetrate the first surface thereby improving the accuracy of the location of the alignment marks in the first surface.

The procedure of the invention therefore eliminates the first layer of photoresist that is present over the areas where the reference alignment marks have to be created in the first surface, thereby eliminating a potential source of light diffusion which is a potential source of error in determining the alignment mismatch between the reference stepper and the matching stepper.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating alignment marks in overlying layers on a surface of a substrate, comprising the steps of:

providing a reference semiconductor substrate having a surface said surface serving as a first surface;

providing a reference stepper that is used to expose said first surface;

providing a reference mask that contains a pattern of reference alignment marks said pattern of reference alignment marks to be created in said first surface of said reference substrate;

depositing a first layer of photoresist over said surface of said reference substrate;

patterning and etching said first layer of photoresist applying photolithographic procedures that use said reference mask as a photolithographic exposure mask thereby removing said layer of first photoresist from above areas in said first surface of said reference substrate where reference alignment marks have to be created;

creating reference alignment marks in said first surface of said reference substrate;

providing a matching stepper whereby said matching stepper is a stepper that is to be used in a semiconductor processing environment;

depositing a second layer having a second surface over said first surface of said reference substrate whereby said second layer contains any material that is suitable to being patterned and etched;

patterning and etching said second layer said patterning and etching to comprise exposing said second surface of said second layer using said matching stepper in combination with said reference mask thereby creating alignment marks in said second surface of said second layer;

measuring alignment errors between said reference alignment marks in said first surface of said reference substrate and said alignment marks in said second surface of said second layer of said reference substrate thereby providing alignment error data;

processing said alignment error data by submitting said error alignment data to modeling software whereby said modeling software provides numerical alignment correction data said numerical alignment correction data being indicative of difference in alignment between said reference stepper and said matching stepper; and apply said numerical alignment correction data to said matching stepper thereby eliminating any alignment differences that may exist between said reference stepper and said matching stepper.

2. The method of claim 1 wherein said creating alignment marks in said first surface of said reference substrate comprises the steps of:

depositing a second layer of photoresist over said surface of said first layer of photoresist;

patterning and etching said second layer of photoresist applying photolithographic procedures that use said reference mask as a photolithographic exposure mask thereby removing said layer of second photoresist from above areas in said surface of said reference substrate where alignment marks have to be created whereby said patterning comprises a high-energy exposure; and etching said first surface of said reference substrate in accordance with said pattern created in said second layer of photoresist thereby creating alignment marks in said first surface of said reference substrate.

3. The method of claim 1 wherein said patterning and etching said first layer of photoresist does not include a step of post-etch baking of said first layer of photoresist.

* * * * *